United States Patent
Tsou et al.

(10) Patent No.: US 10,729,003 B2
(45) Date of Patent: Jul. 28, 2020

(54) ANTI-ELECTROMAGNETIC INTERFERENCE CIRCUIT BOARD

(71) Applicant: ASUSTeK COMPUTER INC., Taipei (TW)

(72) Inventors: Ping-Han Tsou, Taipei (TW); Li-Chien Wan, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/443,980

(22) Filed: Jun. 18, 2019

(65) Prior Publication Data

US 2020/0015350 A1 Jan. 9, 2020

(30) Foreign Application Priority Data

Jul. 5, 2018 (TW) ............................... 107209124 U

(51) Int. Cl.
*H05K 9/00* (2006.01)
*H05K 1/02* (2006.01)
*H05K 1/11* (2006.01)

(52) U.S. Cl.
CPC ......... *H05K 1/0233* (2013.01); *H05K 1/0222* (2013.01); *H05K 9/002* (2013.01); *H05K 9/0033* (2013.01); *H05K 1/115* (2013.01); *H05K 2201/10371* (2013.01)

(58) Field of Classification Search
CPC ....... H05K 9/0026; H05K 2201/10371; H05K 9/0033; H05K 1/0222
See application file for complete search history.

(56) References Cited

U.S. PATENT DOCUMENTS

| 5,353,201 A * | 10/1994 | Maeda | H05K 9/0033 174/362 |
| 7,280,368 B2 * | 10/2007 | Iwamiya | H05K 9/0033 174/377 |
| 8,084,697 B2 * | 12/2011 | Chen | H05K 9/002 174/382 |
| 8,576,569 B2 * | 11/2013 | Malek | H05K 3/32 361/730 |
| 10,034,365 B2 * | 7/2018 | Yang | H05K 1/0216 |
| 2011/0255250 A1 * | 10/2011 | Dinh | G03B 15/03 361/749 |
| 2011/0320667 A1 * | 12/2011 | Chiu | G06F 1/186 710/301 |
| 2012/0038057 A1 * | 2/2012 | Bartley | H01L 25/0657 257/774 |
| 2014/0049935 A1 * | 2/2014 | Chen | H05K 9/0033 361/818 |
| 2017/0164498 A1 * | 6/2017 | Song | H05K 1/181 |

FOREIGN PATENT DOCUMENTS

| CN | 1991671 A | 7/2007 |
| CN | 201422235 Y | 3/2010 |

* cited by examiner

*Primary Examiner* — Hung V Ngo
(74) *Attorney, Agent, or Firm* — McClure, Qualey & Rodack, LLP

(57) ABSTRACT

An anti-electromagnetic interference circuit board includes a circuit board and a magnetic conductor. The circuit board has a plurality of vias, and the magnetic conductor is covered on the circuit board to cover some of the vias. The magnetic conductor includes a plate, a carrier, a sprayed magnetic conductor, and a wave absorbing magnetic conductor.

6 Claims, 1 Drawing Sheet

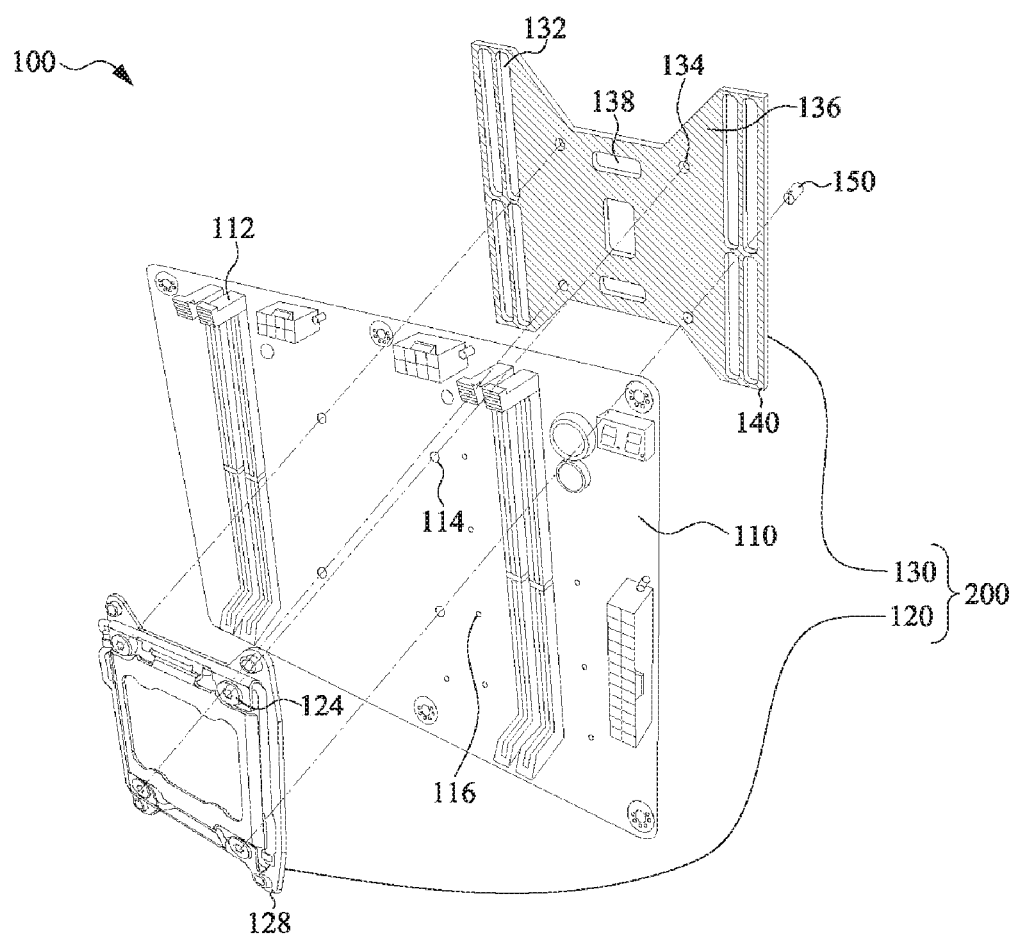

ANTI-ELECTROMAGNETIC INTERFERENCE CIRCUIT BOARD

CROSS-REFERENCE TO RELATED APPLICATION

This application claims the priority benefit of TW application serial No. 107209124, filed on Jul. 5, 2018. The entirety of the above-mentioned patent application is hereby incorporated by reference herein and made a part of the specification.

BACKGROUND OF THE INVENTION

Field of the Invention

The disclosure relates a circuit board and more particularly, to an anti-electromagnetic interference circuit board.

Description of the Related Art

Because a circuit board layout is increasingly dense, in order to increase a wiring area, multi-layer boards are conducted. In the multi-layer boards, different circuit layers communicate with each other through vias. However, once a via is placed around the paths with a high-speed signal transmitting, capacitive and inductive effects are generated, and consequently a radiation magnetic field is generated from the via. In addition, radiation between layers of the circuit board results in an electromagnetic compatibility (EMC) problem, which affects the transmitting quality of the high-speed signal in the circuit.

Conventionally, in order to avoid above-mentioned problems, the sizes of the vias on inner layers are reduced, the thickness of the circuit board is reduced, anti-pads are also used on the circuit board. However, although the conventional method can solve the problems of capacitive and inductive effects, manufacturing costs of the circuit board are increased due to manufacturing of a blind hole and a buried hole. A probability is also occurred that the board is bent and damaged caused by manufacturing a relatively thin board layer.

BRIEF SUMMARY OF THE INVENTION

According to one aspect of the disclosure, an anti-electromagnetic interference circuit board is provided. The anti-electromagnetic interference circuit board includes a circuit board and a magnetic conductor. The circuit board includes a plurality of vias, and the magnetic conductor is covered on the circuit board to cover some of the vias of the circuit board. The magnetic conductor is a sprayed magnetic conductor, or a wave absorbing magnetic conductor.

In the anti-electromagnetic interference circuit board of the disclosure, a position of the magnetic conductor is adjustable according to needs of users, and various magnetic material are used in combination on the circuit board to reduce electromagnetic waves and improve quality of signal transmission.

BRIEF DESCRIPTION OF THE DRAWINGS

FIG. 1 is a three-dimensional schematic diagram of an anti-electromagnetic interference circuit board according to an embodiment of this application.

DETAILED DESCRIPTION OF THE EMBODIMENTS

The following is a detailed description of the embodiments with reference to the accompanying drawings, which are not intended to limit the scope of this application, and the description of the operation of the structure is not intended to limit the order of execution thereof. Any device with the same effects shall fall within this application as long as its structure is merely recombination of components described herein. In addition, the drawings are for illustrative purposes only and are not drawn to the original dimensions. For ease of understanding, the same or similar elements in the following description are denoted by the same reference numerals.

Unless otherwise specified, all the terms as used herein generally have the same meaning as is commonly understood by persons skilled in the art. Some terms used for describing this application will be discussed below or in other parts of this specification, so as to provide additional guidance for persons skilled in the art in addition to the description of the disclosure.

The terms "first", "second", "third", and the like as used herein are used for distinguishing between similar elements or operations and not necessarily for describing a sequence, either temporally, spatially, in ranking or in any other manner or being intended to limit the disclosure.

The terms "comprise", "include", "have" and "contain" used in this specification are all open terms, that is, mean "including, but not limited to".

FIG. 1 is a three-dimensional schematic diagram of an anti-electromagnetic interference circuit board disclosed according to an embodiment of the disclosure. As shown in the figure, the anti-electromagnetic interference circuit board 100 includes a circuit board 110 and a magnetic conductor 200. The circuit board 110 includes a plurality of vias 116.

The magnetic conductor 200 is covered on the circuit board 110 to cover some of the vias 116 of the circuit board 110. Therefore, radiated noise caused by a via effect is effectively reduced, electromagnetic compatibility (EMC) on the circuit board 110 is improved, and a high-speed signal on the circuit board 110 is prevented from being affected by crosstalk, to effectively increase the quality of signal transmission.

In an embodiment, the circuit board 110 is a computer motherboard. However, the disclosure is not limited herein. The circuit board 110 is any circuit board transmitting the high-speed signal and effectively enhances the electromagnetic compatibility through the magnetic conductor 200.

In an embodiment, the magnetic conductor 200 includes a plate 130. The plate 130 is made of a material with magnetic conductivity such as iron, cobalt, nickel, or an alloy thereof, to generate magnetic conductivity directly or indirectly. A magnetic loss effect is increased through the selected magnetic conductivity material, and an effect of absorbing electromagnetic waves is achieved through the magnetic loss effect.

In an embodiment, the magnetic conductor 200 includes a carrier, such as an independent loading mechanism (ILM) 120. The independent loading mechanism 120 is made of a material with magnetic conductivity such as iron, cobalt, nickel, or an alloy thereof, to generate the magnetic conductivity directly or indirectly. A magnetic loss effect is increased through the selected magnetic conductivity material, and an effect of absorbing electromagnetic waves is achieved through the magnetic loss effect.

In an embodiment, the magnetic conductor 200 includes a plate 130 and an independent loading mechanism 120. One of the independent loading mechanism 120 or the plate 130 is made of a material with magnetic conductivity such as of iron, cobalt, nickel, or an alloy thereof, to generate the magnetic conductivity directly or indirectly. A magnetic loss effect is increased through the selected magnetic conductivity material, and an effect of absorbing electromagnetic waves is achieved through the magnetic loss effect.

In an embodiment, the anti-electromagnetic interference circuit board 100 further includes a plurality of clamping elements 150 to clamp the plate 130 on the circuit board 110.

In an embodiment, the independent loading mechanism 120 of the anti-electromagnetic interference circuit board 100 is connected to a grounding terminal 128 and/or the plate 130 is connected to a grounding terminal 140. By conducting a power ground (GND) by the independent loading mechanism 120 and/or the plate 130, an antenna effect is reduced to achieve an effect of reducing the electromagnetic waves.

In an embodiment, the magnetic conductor 200 is a sprayed magnetic conductor that is covered on a surface of the plate 130 through spraying, to achieve an effect of absorbing electromagnetic waves.

In an embodiment, the magnetic conductor 200 is a wave absorbing magnetic conductor that is made of a wave absorbing material formed by carbon, iron, cobalt, nickel, carbide, conductive polymer and an alloy thereof, to generate resistance-type loss, dielectric loss and magnetic loss directly or indirectly, and an effect of absorbing electromagnetic waves is achieved by means of the dielectric loss.

In an embodiment, the circuit board 110 is disposed between the plate 130 and the independent loading mechanism 120.

In an embodiment, alternatively, the plate 130 is disposed between the circuit board 110 and the independent loading mechanism 120. The plate 130 is fixed on the circuit board 110 by using the independent loading mechanism 120.

In an embodiment, the plate 130 includes a plurality of openings 132 and/or a plurality of openings 138 to accommodate space required for protrusions formed by elements on the circuit board 110 such as pins of a connector 112 and other electronic elements.

In an embodiment, the plate 130 further includes an adhesive layer 136 to be attached on the circuit board 110.

In an embodiment, the independent loading mechanism 120 includes a plurality of fixing elements 124 to fix the independent loading mechanism 120 and the plate 130 on the circuit board 110 through a fixating hole 114 of the circuit board 110 and a fixating port 134 of the plate 130, to achieve an effect of reducing electromagnetic waves.

In an embodiment, the magnetic conductor 200 is a sprayed magnetic conductor and is sprayed onto a desired position of the circuit board 100.

In conclusion, in the anti-electromagnetic interference circuit board, a position of the magnetic conductor is adjustable according to needs of users, and various magnetic material are used in combination on the circuit board to reduce electromagnetic waves and improve the quality of signal transmission.

Although the application is disclosed as above by using embodiments, the embodiments are not intended to limit the application. A person skilled in the art makes various variations and improvements without departing from the spirit and scope of the application. Therefore, the protection scope of the application should be subject to the appended claims.

What is claimed is:

1. An anti-electromagnetic interference circuit board, comprising:
    a circuit board, having a plurality of vias, and
    a magnetic conductor, covered on the circuit board to cover some of the vias, wherein the magnetic conductor comprises a magnetic plate and a magnetic carrier, and the magnetic plate comprises a plurality of openings to accommodate pins of connectors on the circuit board.

2. The anti-electromagnetic interference circuit board according to claim 1, wherein the magnetic plate further comprises an adhesive layer to be attached on the circuit board.

3. The anti-electromagnetic interference circuit board according to claim 1, wherein the magnetic carrier comprises a plurality of fixing elements to fix the magnetic carrier and the magnetic plate on the circuit board.

4. The anti-electromagnetic interference circuit board according to claim 1, further comprising a plurality of clamping elements to clamp the magnetic plate on the circuit board.

5. The anti-electromagnetic interference circuit board according to claim 1, further comprising a grounding terminal to connect to the magnetic plate or the magnetic carrier.

6. The anti-electromagnetic interference circuit board according to claim 1, wherein the magnetic conductor is a sprayed magnetic conductor, or a wave absorbing magnetic conductor.

* * * * *